(12) United States Patent
Hunt et al.

(10) Patent No.: US 10,405,465 B2
(45) Date of Patent: Sep. 3, 2019

(54) TOPOLOGICAL INSULATOR THERMAL MANAGEMENT SYSTEMS

(71) Applicant: The Boeing Company, Chicago, IL (US)

(72) Inventors: Jeffrey H. Hunt, Thousand Oaks, CA (US); Wayne R. Howe, Irvine, CA (US); Angela W. Li, Everett, WA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 15/836,427

(22) Filed: Dec. 8, 2017

(65) Prior Publication Data

US 2019/0150315 A1 May 16, 2019

Related U.S. Application Data

(63) Continuation-in-part of application No. 15/815,506, filed on Nov. 16, 2017.

(51) Int. Cl.
| | | |
|---|---|---|
| *H05K 7/20* | (2006.01) | |
| *C09K 5/06* | (2006.01) | |
| *H01B 1/02* | (2006.01) | |
| *H01L 23/373* | (2006.01) | |
| *H01L 21/48* | (2006.01) | |

(52) U.S. Cl.
CPC .............. *H05K 7/209* (2013.01); *C09K 5/063* (2013.01); *H01B 1/026* (2013.01); *H01L 21/4871* (2013.01); *H01L 23/373* (2013.01); *H01L 23/3737* (2013.01); *H05K 7/20945* (2013.01)

(58) Field of Classification Search
CPC .. H05K 7/209; H05K 7/20945; H05K 7/2039; H05K 7/20454–7/20481; H05K 1/0201–1/0204; H05K 1/09–1/097; C09K 5/063; H01B 1/026
USPC ........... 361/704–706, 709–710, 718, 679.54; 257/700–707; 174/256–258
See application file for complete search history.

(56) References Cited

U.S. PATENT DOCUMENTS

| | | |
|---|---|---|
| 5,508,489 A | 4/1996 | Benda et al. |
| 6,815,636 B2 | 11/2004 | Chung et al. |
| 7,515,986 B2 | 4/2009 | Huskamp |
| 9,296,007 B2 | 3/2016 | Li et al. |
| 9,630,209 B2 | 4/2017 | Hunt et al. |
| 9,632,542 B2 | 4/2017 | Li et al. |

(Continued)

FOREIGN PATENT DOCUMENTS

WO WO 2013/086227 A1 6/2013

OTHER PUBLICATIONS

Ando et al., "Topological Insulator Materials," Journal of the Physical Society of Japan, Invited Review Papers, 2013, pp. 1-36.
(Continued)

*Primary Examiner* — Dion Ferguson
*Assistant Examiner* — Amir A Jalali
(74) *Attorney, Agent, or Firm* — MH2 Technology Law Group LLP

(57) ABSTRACT

An electrical device includes an electrical component configured to generate heat during operation of the electrical device. A thermal management coating is configured to transfer heat from the electrical component by thermal conduction. The thermal management coating comprises a non-carbon based topological insulator.

20 Claims, 4 Drawing Sheets

(56) References Cited

U.S. PATENT DOCUMENTS

| | | | |
|---|---|---|---|
| 9,732,418 B2 | 8/2017 | Li et al. | |
| 2010/0140723 A1 | 6/2010 | Kurtz et al. | |
| 2011/0103020 A1* | 5/2011 | Dangelo | B82Y 10/00 361/709 |
| 2012/0138115 A1* | 6/2012 | Chen | H01L 35/32 136/205 |
| 2013/0299780 A1* | 11/2013 | McQueen | H01L 31/022408 257/14 |
| 2014/0160835 A1* | 6/2014 | Soree | H01L 43/02 365/158 |
| 2014/0199542 A1 | 7/2014 | Li et al. | |
| 2015/0060952 A1* | 3/2015 | Takulapalli | G01N 27/4145 257/253 |
| 2015/0165556 A1 | 6/2015 | Jones et al. | |
| 2015/0174695 A1 | 6/2015 | Elfstroem et al. | |
| 2015/0221784 A1* | 8/2015 | McQueen | H01L 31/022425 257/459 |
| 2015/0255184 A1* | 9/2015 | Li | H01L 23/29 428/336 |
| 2015/0257308 A1* | 9/2015 | Li | H05K 7/20427 361/706 |
| 2015/0337145 A1* | 11/2015 | Torrisi | C09D 11/037 428/207 |
| 2016/0027938 A1* | 1/2016 | Stoica | H01L 31/0322 257/190 |
| 2016/0082617 A1 | 3/2016 | Howe et al. | |
| 2016/0116679 A1 | 4/2016 | Muendel et al. | |
| 2016/0158889 A1 | 6/2016 | Carter et al. | |
| 2016/0168692 A1 | 6/2016 | Li et al. | |
| 2016/0276619 A1* | 9/2016 | Cheng | H01L 51/56 |
| 2016/0284394 A1* | 9/2016 | Tominaga | H01L 43/08 |
| 2016/0364062 A1* | 12/2016 | Lu | G06F 3/045 |
| 2017/0062711 A1* | 3/2017 | Saito | H01L 27/105 |
| 2017/0090119 A1 | 3/2017 | Logan et al. | |
| 2017/0173737 A1 | 6/2017 | Gray | |
| 2017/0263726 A1* | 9/2017 | Huang | G02F 1/134309 |
| 2017/0306476 A1 | 10/2017 | Li et al. | |
| 2017/0316487 A1* | 11/2017 | Mazed | G06F 19/70 |
| 2018/0175312 A1* | 6/2018 | Carroll | H01L 29/861 |
| 2018/0186640 A1* | 7/2018 | Sutto | C01B 19/04 |
| 2018/0210148 A1* | 7/2018 | Kim | G02B 6/12007 |

OTHER PUBLICATIONS

Hasan et al., "Colloquium: Topological Insulators," The Amer, Phys. Soc., Reviews of Modern Physics, vol. 82, Oct.-Dec. 2010, pp. 3045-3067.

Hills et al., "From Graphene and Topological Insulators to Weyl Semimetals," WSPC/Instruction File, 2015, pp. 1-33.

Hla, "Single Atom Extraction by Scanning Tunneling Microscope Tip-Crash and Nanoscale Surface Engineering," Nanoscale & Quantum Phenomena Institute, Physics & Astronomy Department, Ohio University, Athens, OH, date unknown, pp. 1-15.

Hla, "STM Single, Atom/Molecule Manipulation and Its Application to Nanoscience and Technology." Critical Review article, J. Vac. Sci. Tech, 2005, p. 1-12.

Khanikaev et al., Photonic Topological Insulators, Nature Materials, vol. 12, Mar. 2013, pp. 233-239.

Kong et al., "Opportunities in Chemistry and Materials Science for Topological Insulators and Their Nanostructures," Nature Chemistry, vol. 3, Nov. 2011, pp. 845-849.

Kuzmenko et al., Universal Dynamical Conductance in Graphite, DPMC, University of Geneva, Swuitzerland, 2007, pp. 1-5.

Li et al., "Marginal Topological Properties of Graphene: a Comparison with Topological Insulators," DPMC, University of Geneva, Switzerland, 2012, pp. 1-9.

Mak et al., "Optical Spectroscopy of Graphene: From the Far Infrared to the Ultraviolet," Solid State Communications, 152 (2012), 1341-1349.

Mingareev et al., "Laser Additive Manufacturing Going Mainstream," Optics and Photonics News, Feb. 2017, 8 pages.

Moore, "The Birth of Topological Insulators," Nature, vol. 464, Insight Perspective (2010), pp. 194-198.

Peng et al., "Topological Insulator Nanostructures for Near-Infrared Transparent Flexible Electrodes," Nature Chemistry, vol. 4, Apr. 2012, pp. 281-286.

Qi et all, "Topological Insulators and Superconductors," arXiv:1008.2026v1 [cond-mat.mes-hall], (2010), pp. 1-54.

Zhang, "Viewpoint: Topological States of Quantum Matter," American Physical Society, Physics 1,6 (2008), 3 pages.

Zhu et al., "Optical Transmittal of Multilayer Graphene," EPL, 106 (2014) 17007, 4 pages.

Gu, "Chapter 2—Laser Additive Manufacturing (AM): Classification, Processing Philosophy, and Metallurgical Mechanisms, Laser Additive Manufacturing of High-Performance Materials," 2015, XVII, pp. 15-24.

Wikipedia, Graphene, http://en.wikipedia.org/wiki/Graphene, 29 pages, download Nov. 15, 2017.

Wikipedia, Scanning Tunneling Microscope, http://en.wikipedia.org/wiki/Scanning_Tunneling_Microscope, 9 pages.

Wikipedia, "Nanometre," https://en.wikipedia.org/wiki/Nanometre, 2 pages.

Wikipedia, "Carbon Nanotube," https://en.wikipedia.org/wiki/Carbon_Nanotube, 22 pages.

Hunt et al., "Electronic Components Coated With a Topological Insulator," U.S. Appl. No. 15/815,572, filed Nov. 16, 2017.

* cited by examiner

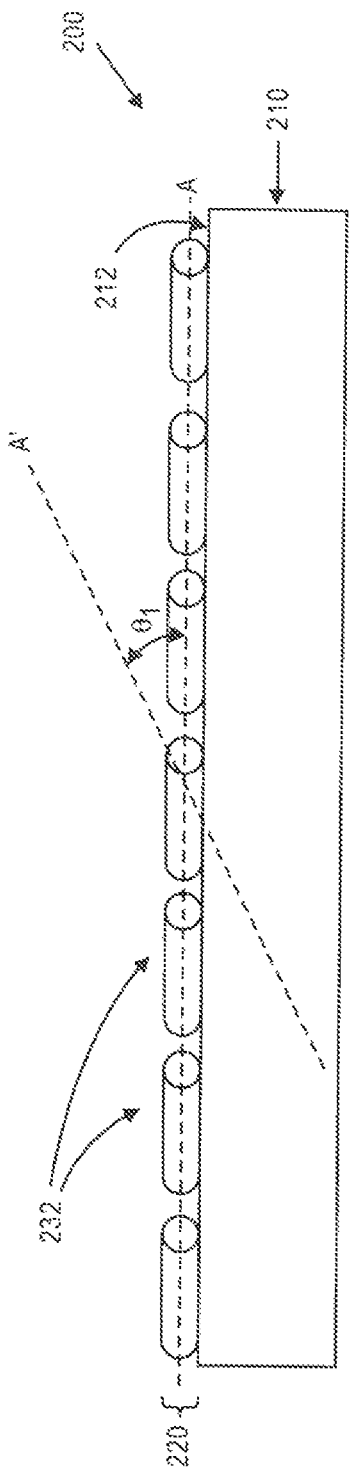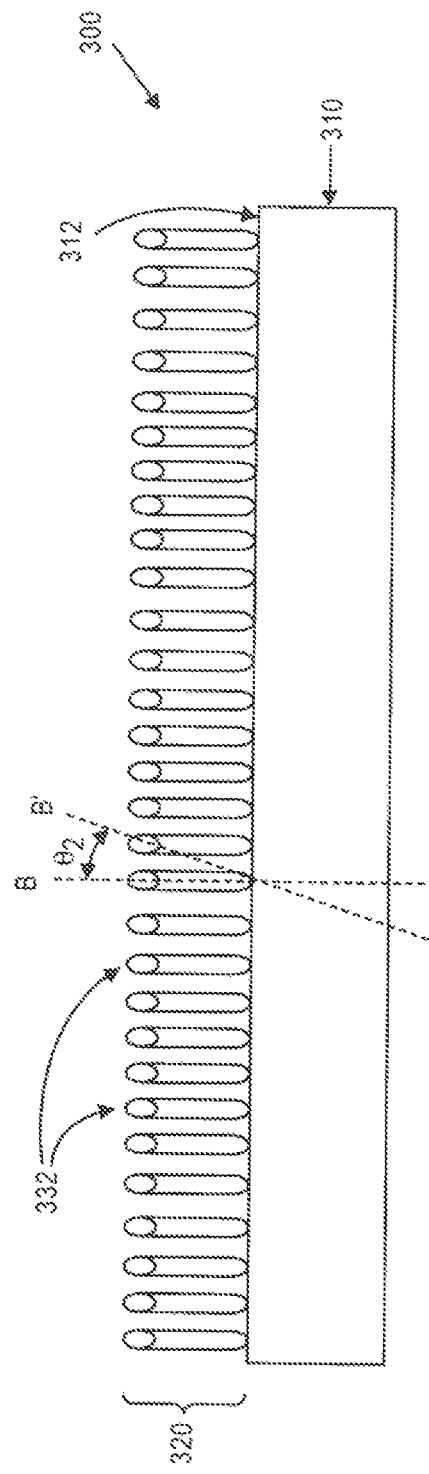

TOPOLOGICAL INSULATOR THERMAL MANAGEMENT SYSTEMS

DETAILED DESCRIPTION

Field of the Disclosure

The present disclosure is directed to systems for managing thermal energy in electrical devices.

Background

Electrical devices and electrical connections are often sensitive to thermal stress. In addition, many electrical components generate unwanted heat. As a result, it is often desirable to transport thermal energy away from electrical components in order to prevent temporary or permanent damage to the electrical components due to thermal stress. One known method employs metal bases, such as copper bases, to absorb and conduct the thermal energy away from the electrical components. Unfortunately, the metal bases employed in such methods can be heavy and/or bulky, adding excessive weight and/or taking up excessive volume. In many applications, such as aerospace applications, additional weight and volume are undesirable.

Graphene is a known material for potential low weight thermal management applications. Graphene is carbon-based (e.g., is composed primarily of carbon). Put into graphene form, the carbon's electronic properties are enhanced, but not necessarily the thermal properties. This is because graphene's high thermal conductivity depends strongly upon the film being thin. As graphene thickness is increased, its thermal properties start to change, so that the two-dimensional topology that provides high thermal conductivity is lost. At a thickness of about 20 to 30 layers of graphene, the material exhibits thermal characteristics more like "bulk" graphite than a single graphene layer. This effectively limits the usefulness of graphene as a thermal conductor, because very thin layers of graphene are limited in the amount of heat they can transfer.

Thus, there is a need in the art for improved thermal management systems for electrical components.

SUMMARY

The present disclosure is directed to an electrical device. The electrical device comprises an electrical component configured to generate heat during operation of the electrical device. A thermal management coating is configured to transfer heat from the electrical component by thermal conduction, the thermal management coating comprising a non-carbon based topological insulator.

The present disclosure is also directed to a method of making an electrical device. The method comprises depositing a thermal management coating on an electrical component. The thermal management coating is configured so as to transfer heat from the electrical component by thermal conduction during operation of the electrical device, the thermal management coating comprising a non-carbon based topological insulator.

The present disclosure is also directed to a method of managing heat in an electrical device. The method comprises supplying current to an electrical component positioned in the electrical device, the electrical component generating heat. A thermal management coating is positioned on the electrical device to transfer heat from the electrical component by thermal conduction, the thermal management coating comprising a non-carbon based topological insulator.

The present disclosure is also directed to a coating comprising a non-carbon based topological insulator deposited on a substrate. The coating further comprises a plurality of carbon nanotubes that are on, and extend from, the non-carbon based topological insulator.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrate aspects of the present teachings and together with the description, serve to explain the principles of the present teachings.

FIG. 2 illustrates a schematic, cross-sectional view of an electrical device, according to an implementation of the present disclosure.

FIG. 3 illustrates a schematic, cross-sectional view of an electrical device, according to an implementation of the present disclosure.

Figure 1:
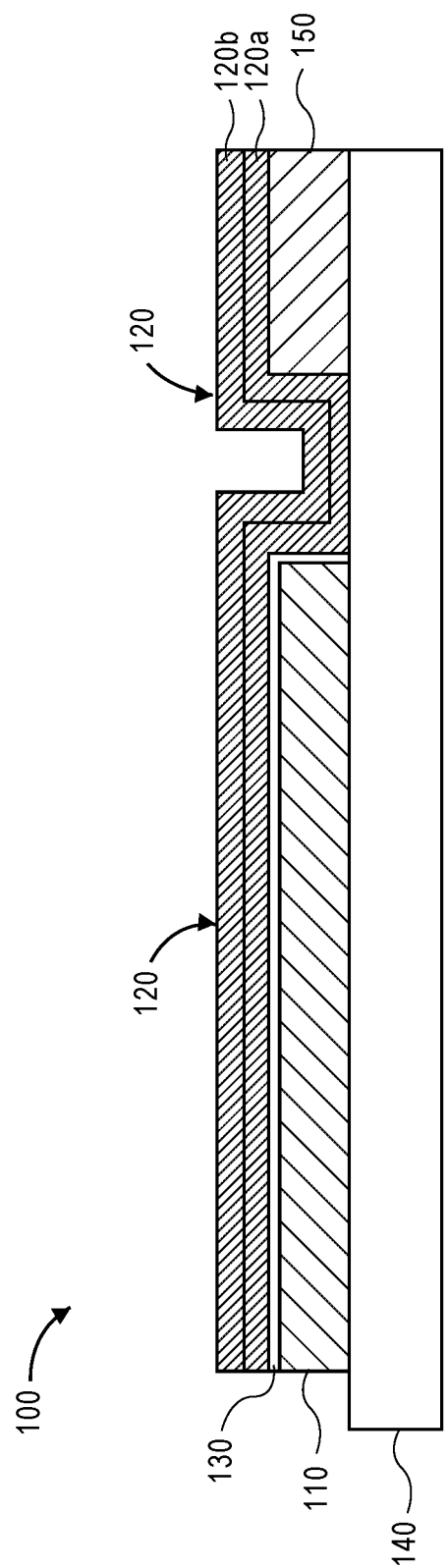
FIG. 1 illustrates a schematic, cross-sectional view of an electrical device, according to an implementation of the present disclosure.

It should be noted that some details of the figures have been simplified and are drawn to facilitate understanding rather than to maintain strict structural accuracy, detail, and scale.

DESCRIPTION

Reference will now be made in detail to the present teachings, examples of which are illustrated in the accompanying drawings. In the drawings, like reference numerals have been used throughout to designate identical elements. In the following description, reference is made to the accompanying drawings that form a part thereof, and in which is shown by way of illustration specific examples of practicing the present teachings. The following description is, therefore, merely exemplary.

FIG. 1 illustrates an electrical device 100. Electrical device 100 comprises an electrical component 110 configured to generate heat during operation of the electrical device. The phrase "configured to generate heat" is intended to include any heat generated during the normal operation of an electrical device, including unwanted or waste heat generated due to electrical resistance or other means. A thermal management coating 120 is configured to transfer heat from the electrical component 110 by thermal conduction. The thermal management coating 120 comprises a non-carbon based topological insulator.

The electrical component 110 can be any electrical component that generates heat when in operation. Examples of such electrical components include any active or passive electrical device, such as one or more of an electrical contact, a transformer, a resistor, a capacitor, a battery, an inductor, a microprocessor, an integrated circuit, a memory device or a circuit board. In some implementations, an electrical component comprises a circuit board such as a printed circuit board, which may include one or more electronic connections or connectors. Moreover, an electrical component can comprise or be formed from any suitable material. For example, in some implementations, an electrical component comprises or is formed from a laminate such as a copper-clad laminate, a resin impregnated B-stage cloth, an epoxy, a liquid photoimageable solder mask ink, and/or a dry film photoimageable solder mask. In some implementations, an electrical component comprises or is formed from a semiconductor material such as Si, Ge, or InP; a metal such as aluminum, stainless steel, gold, silver, or cooper; and/or a dielectric material such as sapphire, $SiO_2$, and SiC. Any other suitable materials may also be used. Semiconductors, in particular, are poor conductors, and therefore may have exacerbated waste heat problems compared with other devices. Dealing with waste heat challenges often drives IC design. The thermal management solutions presented by this disclosure can provide a solution for addressing such waste challenges.

In one implementation, the thermal management coating 120 is directly on, and physically contacts, the electrical component 110. Alternatively, one or more intervening optional layers 130 are positioned between the thermal management coating 120 and the electrical component 110. Such optional layers can include, for example, electrical insulating layers, adhesion layers for improving adhesion between the thermal management coating 120 and the electrical component 110, and/or additional thermally conductive layers for enhancing thermal conduction between the electrical component 110 and the thermal management coating 120. In an example, the optional layers 130 comprise an insulating layer selected from an organic or inorganic electrical insulating material, such as a polymer, plastic, silicon dioxide, ceramic or other suitable material. The electrical insulating layer can have any suitable thickness, such as, for example, a thickness ranging from about 10 nm to about 10 microns, such as about 50 nm to about 5 microns, or about 100 nm to about 1 micron.

Optionally, the electrical device 100 can further comprise a substrate assembly 140 on which the electrical component 110 is disposed. A heat sink 150 can optionally be positioned on the substrate assembly 140. Any suitable passive and/or active heat sinks can be employed. Examples of suitable passive heat sinks include any suitably large structure comprising a material with a heat capacity sufficient to absorb and/or dissipate the amount of heat generated, such as, for example, copper or diamond. A suitably large heat sink may be, for example, 5 to 1000 times the mass and volume associated with the active elements in question, such as 10 to 100 times the mass and volume. Examples of suitable active heat sinks include, for example, a Peltier cooler or any other such known or later developed active device. During operation of the electrical device 100, heat can be transferred from the electrical component 110 to the heat sink 150 by conductive heat transfer via the thermal management coating 120.

The thermal management coating 120 can comprise any suitable non-carbon based topological insulator. The term "non-carbon based topological insulator" is defined herein to mean any topological insulator having less than 10% by weight of carbon. As further examples, the topological insulator can have less than 5%, or less than 1% by weight of carbon, such as no or substantially no carbon. Unlike graphene, non-carbon based topological insulators can potentially be increased in thickness without losing the relatively high thermal conductivity associated with very thin layers of the non-carbon based topological insulator. Examples of suitable non-carbon based topological insulators include topological insulators comprising an element of antimony (Sb), bismuth (Bi), selenium (Se) or tellurium (Te), or combinations thereof. For instance, the thermal management coating 120 can comprise, consist essentially of, or consist of, but is not limited to, a compound of $Bi_{1-x}Sb_x$ (0<x<1) (e.g., $Bi_{0.9}Sb_{0.1}$), $Bi_{1-x}Te_x$ (0<x<1), $Bi_{1-x}Te_x$ (0<x<1), Sb, $Bi_2Se_3$, $Bi_2Te_3$, $Sb_2Te_3$, $Bi_2Te_2Se$, $(Bi,Sb)_2Te_3$ (e.g., $(Bi_{0.2}Sb_{0.8})_2Te_3$), $Bi_{2-x}Sb_xTe_{3-y}Se_y$ (0≤x≤2; 0≤y≤3), $Bi_{2-x}Sb_xTe_{3-y}Se_y$ (0≤x≤2; 1≤y≤3) (e.g., $Bi_2Te_{1.95}Se_{1.05}$, $BiSbTe_{1.25}Se_{1.75}$), $Bi_2Te_{1.6}S_{1.4}$, $Bi_{1.1}Sb_{0.9}Te_2S$, $Sb_2Te_2Se$, $Bi_2(Te,Se)_2(Se,S)$, $TlBiSe_2$, $TlBiTe_2$, $TlBi(S_{1-x}Se_x)_2$ (0.5≤x≤1), $Pb(Bi_{1-x}Sb_x)_2Te_4$ (0≤x≤1), $PbBi_2Te_4$, $PbSb_2Te_4$, $PbBi_4Te_7$, $GeBi_2Te_4$, $GeBi_{4-x}Sb_xTe_7$ (0≤x≤4), $(PbSe)_5(Bi_2Se_3)_3$, $(PbSe)_5(Bi_2Se_3)_6$, $(Bi_2)(Bi_2Se_{2.6}S_{0.4})$, $Bi_4Se_3$, $Bi_4Se_{2.6}S_{0.4}$, $(Bi_2)(Bi_2Te_3)_2$, SnTe, $Pb_{1-x}Sn_xSe$ (0<x<_1), $Pb_{1-x}Sn_xTe$ (0<x<_1), $Pb_{0.77}Sn_{0.23}Se$, $Bi_{1.84-x}Fe_{0.16}Ca_xSe_3$ (0≤x<1.84), $Cr_{0.08}(Bi_{0.1}Sb_{0.9})_{1.92}Te_3$, $(Dy_xBi_{1-x})_2Te_3$ (0<x<_1), $Ni_xBi_{2-x}Se_3$ (0<x<_2), $(Ho_xBi_{1-x})_2Se_3$ (0≤x<1), $Ag_2Te$, $SmB_6$, $Bi_{14}Rh_3I_9$, $Bi_{2-x}Ca_xSe_3$ (0<x<_2), $Bi_{2-x}Mn_xTe_3$ (0<x<_2) (e.g., $Bi_{1.91}Mn_{0.09}Te_3$, $Bi_{1.96}Mn_{0.04}Te_3$, $Bi_{1.98}Mn_{0.02}Te_3$), $Ba_2BiBrO_6$, $Ba_2BiIO_6$, $Ca_2BiBrO_6$, $Ca_2BiIO_6$, $Sr_2BiBrO_6$, or $Sr_2BiIO_6$, or combinations thereof. The thermal management coating 120 can comprise a two-dimensional monolayer or a three-dimensional layer having any desired thickness described herein for the thermal management coating.

The thermal management coating 120 can comprise one or more layers of the topological insulator. In one implementation, the thermal management coating 120 comprises a plurality of layers 120a,120b of the topological insulator. The topological insulator layers are stacked so that each layer of the plurality of layers physically contacts at least one adjacent layer of the plurality of layers. Any number of topological insulators can be employed. For example, the thermal management coating can comprise 2 to 25 layers or more of the topological insulator, such as 5 to 20 layers, thereby providing for a relatively thin, lightweight material of relatively high thermal conductivity as disclosed herein. Alternatively, the thermal management coating can comprise more than 25 layers, such as 30 or 40 layers to 10,000 layers or more. Such relatively thick layers can allow for an increased rate of heat transfer compared to thinner layers while still providing the same or similar thermal conductivity of the thinner layers.

Thus, unlike graphene, which has significantly reduced thermal conductivity except where it is employed in very thin layers, the non-carbon based topological insulators of the present disclosure can be made thicker, while still maintaining the high thermal conductivity of the two-dimensional material. The thermal management coating can have any suitable thickness that will provide the desired heat transfer away from the electrical component. For example, the thermal management coating can have a thickness ranging from about 10 nm to about 10 microns, such as about 10 nm to about 1 micron, or about 10 nm to about 100 nm, or about 20 nm to about 10 microns, or about 30 nm to about 1 micron, or about 40 nm to about 100 nm. Any other suitable thicknesses can also be employed, where it is understood that thinner layers provide for relatively lightweight heat transfer, while thicker layers provide for increased rate of heat transfer compared to the thinner layers.

Theoretical reasons for why the topological insulators can be made thicker, while still maintaining high thermal conductivity will now be discussed. Individual atoms have quantized discrete energy levels which are occupied by each individual atom's electrons. In the case of a solid, however, many atoms are in close proximity to one another and the discrete energy levels of the individual atoms combine to form so-called "energy bands." These energy bands are defined by energies that can be determined by spectroscopically measuring the bandgap in the solid, for example, according to known spectroscopic methods, such as wavelength modulation spectroscopy. Generally, photons having energy values that lie below the bandgap will transmit through the solid while photons having energy values at or above the bandgap will be strongly absorbed. In wavelength modulation spectroscopy, the relative absorption of the photons is correlated with the band density of states.

The energy bands describe electron behavior within the solid. For example, in these energy bands, electron energy can be described as a function of the electron's wave-vector as the electron travels through the solid. Macroscopic behavior of many electrons in the solid—electrical conductivity, thermal conductivity, and the like—result from the band structure. Ordinarily, the geometric construction of solids do not have an effect on the band structure. However, for very thin solids such as graphene, not only does the solid's geometry change but so too does its band structure. That is, for thin solids, the electron behavior changes as the geometry of the solid changes. Thus, whether a solid is a defined as a "2D-" or "3D-structure" depends on the solid's band structure. For example, graphene is monoatomic and its 2D band structure only exists when it is one atomic layer thick. The addition of more atomic layers (i.e., from single-layer graphene to few-layer graphene) not only increases graphene's thickness, but also changes its band structure toward its 3D configuration. In contrast, topological insulators comprise several different atoms and can be molecularly engineered. Thus, unlike graphene which faces the aforementioned issues to changes in its band structure, a topological insulator largely maintains its 2D band structure even as the material's thickness is changed.

FIGS. 2 and 3 each illustrate an electrical device comprising a thermal management coating 220,320 that includes nanotubes made from a non-carbon based topological insulator, according to implementations described herein. Non-carbon based topological insulator nanotubes are known in the art and one of ordinary skill in the art would be able to apply them in the thermal management coatings 220, 320 of the present disclosure.

With reference to FIG. 2, an electrical device 200 comprises an electrical component 210 and a thermal management coating 220 comprising a topological insulator disposed on a surface 212 of the electrical component 210. One or more optional layers (not shown), such as an electrical insulating layer, adhesion layer or additional thermally conductive layer, can be positioned between the surface 212 and the thermal management coating 220. In the implementation of FIG. 2, the thermal management coating 220 comprises a plurality of topological insulator nanotubes 232 oriented horizontally or substantially horizontally on the surface 212 of the electrical component 210. Horizontal orientation is relative to the surface 212. For reference purposes herein, a "horizontal" orientation comprises an orientation wherein the long axis of a topological insulator nanotube 232 is oriented parallel to the surface 212. In the implementation of FIG. 2, all of the topological insulator nanotubes 232 are depicted as having a long axis oriented parallel to the surface 212. However, other arrangements are possible. For example, in some implementations, one or more topological insulator nanotubes can have a long axis along line A' in FIG. 2 or along some other direction that is not parallel to the surface 212. As defined herein, a "substantially horizontal" orientation is an orientation wherein the long axis (A') of a topological insulator nanotube forms an angle ($\theta_1$) of less than about 45 degrees with a line (A) parallel to the surface 212 of the electrical component 210. In some implementations, the angle ($\theta_1$) is less than about 30 degrees or less than about 15 degrees. In some implementations, the angle ($\theta_1$) is between about 0 degrees and about 30 degrees. In some implementations, a majority of the topological insulator nanotubes of a thermal management coating described herein have a horizontal or substantially horizontal orientation. Further, in some implementations, at least about 60 percent, at least about 70 percent, at least about 80 percent, or at least about 90 percent of the topological insulator nanotubes of a thermal management coating have a horizontal or substantially horizontal orientation.

In other implementations, the topological insulator nanotubes of a thermal management coating can be oriented vertically or substantially vertically. For example, with reference to FIG. 3, an electrical device 300 comprises an electrical component 310 and a thermal management coating 320 disposed on a surface 312 of the electrical component 310. One or more optional layers (not shown), such as an electrical insulating layer, adhesion layer or additional thermally conductive layer, can be positioned between the surface 312 and the thermal management coating 320. In the implementation of FIG. 3, the thermal management coating 320 comprises a plurality of topological insulator nanotubes 332 oriented vertically or substantially vertically on the surface 312 of the electrical component 310. Vertical orientation is relative to the surface 312. For reference purposes herein, a "vertical orientation" comprises an orientation wherein the long axis of a topological insulator nanotube 332 is oriented perpendicular to the surface 312. In the implementation of FIG. 3, all of the topological insulator nanotube 332 are depicted as having a long axis oriented perpendicular to the surface 312. However, other arrangements are possible. For example, in some implementations, one or more topological insulator nanotubes can have a long axis along line B' in FIG. 3 or along some other direction that is not perpendicular to the surface 312. A "substantially vertical" orientation, as defined herein, is an orientation wherein the long axis (B') of a topological insulator nanotube forms an angle ($\theta_2$) of less than about 45 degrees with a line (B) perpendicular to the surface of the electrical component. In some implementations, the angle ($\theta_2$) is less than about 30 degrees or less than about 15 degrees. In some implementations, the angle ($\theta_2$) is between about 0 degrees and about 30 degrees. In some implementations, a majority of the topological insulator nanotubes 332 have a vertical or substantially vertical orientation. Further, in some implementations described herein, at least about 60 percent, at least about 70 percent, at least about 80 percent, or at least about 90 percent of the topological insulator nanotubes 332 have a vertical or substantially vertical orientation.

In addition, in some implementations, the thermal management coating described herein comprises, consists, or consists essentially of a monolayer of topological insulator nanotubes, including a monolayer of horizontally or substantially horizontally oriented topological insulator nanotubes or a monolayer of vertically or substantially vertically oriented topological insulator nanotubes.

Figure 4:
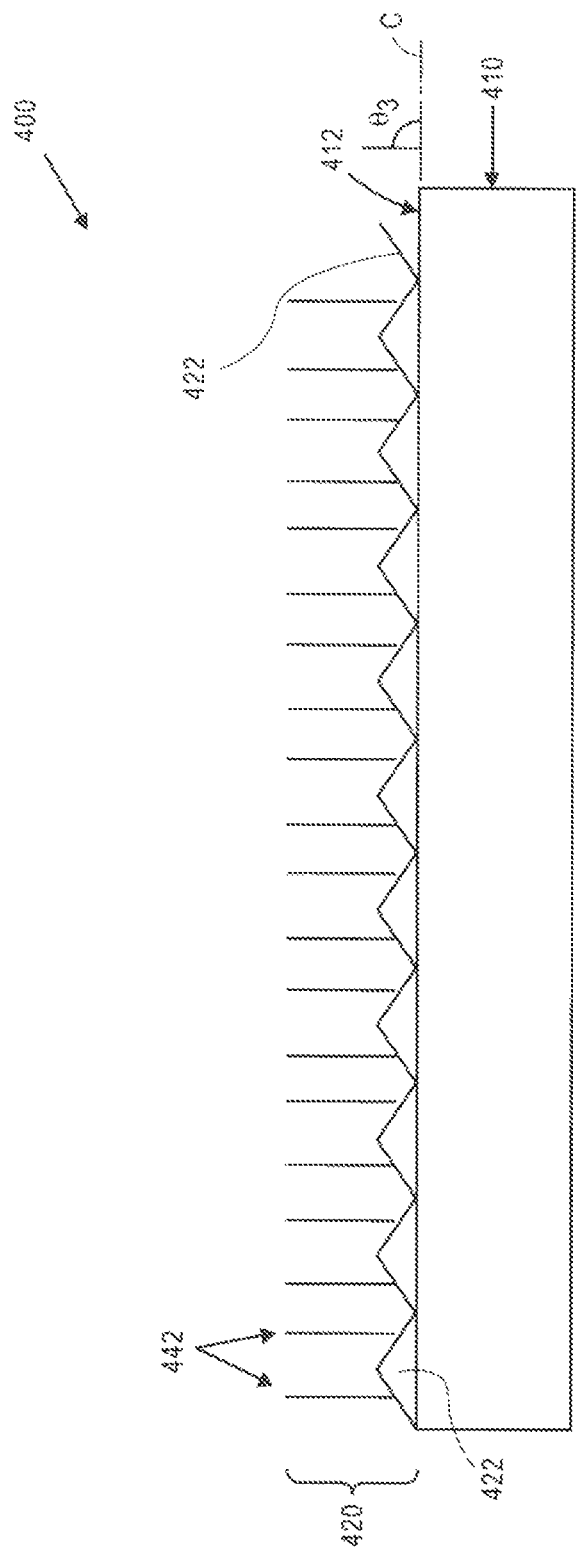
FIG. 4 illustrates a schematic, cross-sectional view of an electrical device, according to an implementation of the present disclosure.

Referring to FIG. 4, carbon nanoparticles, such as carbon nanotubes, can be positioned on, and/or can extend from, the coating. The carbon nanoparticles can be elongated, such as carbon nanotubes, and have an aspect ratio ranging from about 5:1 to about 1000:1, such as about 10:1 to about 100:1, although nanoparticles with aspect ratios outside of these ranges may also be employed. The plurality of carbon nanoparticles extend from the thermal management coating at an angle ($\theta_3$) of from 0° to 90°, such as from 30° to 70°, relative to a direction of a line (C) that is parallel to the outermost surface 412 of the electrical component.

FIG. 4 illustrates a side view of an electrical device 400 comprising an electrical component 410 and a thermal management coating 420 comprising a topological insulator layer 422 and a layer of aligned carbon nanoparticles 442 disposed on the topological insulator layer 422. The topological insulator layer 422 can be formed on an outermost surface 412 of the electrical component 410. The topological insulator layer 422 can comprise a two-dimensional monolayer or a three-dimensional layer having any desired thickness described herein for the thermal management coating.

As with the other figures herein, the various elements depicted in FIG. 4 are representational only and are not necessarily drawn to scale. Further, in some cases, one or more intervening optional layers (not shown) are positioned between the thermal management coating 120 and the electrical component 110. Such optional layers can include, for example, electrical insulating layers, adhesion layers and/or additional thermally conductive layers.

A layer of aligned carbon nanoparticles 442 described herein can have any desired thickness. In some implementations, for example, a layer of aligned carbon nanoparticles has an average thickness of about 1 nm to about 500 nm, such as about 10 nm to about 300 nm or about 20 nm to about 200 nm. In some implementations, a layer of aligned carbon nanoparticles has an average thickness of about 5 nm to about 100 nm or about 10 nm to about 50 nm. As one example, the layer of aligned carbon nanoparticles 442 comprises an array of carbon nanotubes ("CNT") aligned to be vertical, or substantially vertical (0 to less than 45°, as defined herein) relative to a line parallel with the outermost surface 412 of the electrical component.

Techniques for aligning the carbon nanotubes are well known in the art. For example, alignment can be accomplished mechanically (e.g., with a "micro-tweezer") or electrically, such as by the application of an AC or DC voltage, which will interact with the electric dipole moment of the nanotubes to align the nanotubes. The carbon nanotubes can be placed in physical contact with the topological insulator layer 422 before, during or after alignment. Prior to contacting the CNT to the topological insulator layer 422, the topological insulator layer can be cleaned using any suitable cleaning process to allow for direct physical contact of the CNT and the topological insulator layer. The cleaning process can include, for example, chemical and/or electrical cleaning techniques. Once the nanotubes are in physical contact with the topological insulator layer 422, they will adsorb naturally onto the layer due to Vander Waals attraction. Alternatively, they can be "driven" into the topological insulator layer 422 with the application of an external voltage.

The thermal management coatings described herein can be disposed on any surface of any electrical component not inconsistent with the objectives of the present disclosure. For example, in some instances, the surface is a heat-generating surface of the electrical component. In yet other implementations, the coatings of the present disclosure can be deposited on any suitable substrate that is not an electrical device and/or does not comprise an electrical component. For instance, the substrate can be any substrate for which thermal management is desired, such as a substrate used for devices (e.g., optical or mechanical devices) that may be exposed to external heat sources. In one such implementation, the coating comprises a non-carbon based topological insulator deposited on a substrate; and a plurality of carbon nanotubes on, and extending from, the non-carbon based topological insulator. The plurality of carbon nanotubes can be arranged in any manner described herein. For example, the carbon nanotubes can extend from the coating at an angle of from 0° to 90° relative to a direction parallel to an outermost surface of the substrate on which the coating is deposited.

Further, the thermal management coating described herein, in some implementations, can exhibit one or more desired properties, such as low mass relative to the overall mass of the electrical device. For example, in some instances, the thermal management coating comprises from about 0.001 weight percent to about 0.3 weight percent, such as about 0.001 weight percent to about 0.1 weight percent, such as about 0.001 weight percent to about 0.01 weight percent, or about 0.005 weight percent to about 0.01 weight percent of the electrical device, based on the total weight of the electrical device.

Additionally, in some implementations, the thermal management coatings described herein exhibits high thermal conductance. For example, in some cases, the thermal management coating exhibits a thermal conductance ranging from about 10 MW/m$^2$K to about 50 MW/m$^2$K, such as about 15 MW/m$^2$K to about 50 MW/m$^2$K, or about 20 MW/m$^2$K to about 50 MW/m$^2$K, or about 25 MW/m$^2$K to about 50 MW/m$^2$K, or about 30 MW/m$^2$K to about 50 MWIm$^2$K. The thermal conductance is measured by a pulse photothermal reflectance (PPR) technique, such as that described in Li et al., "Heat Conduction across Multiwalled Carbon Nanotube/Graphene Hybrid Films," IEEE 2011 13th Electronics Packaging Technology Conference, pages 63-66. In some implementations, the topological insulators can have a thermal conductivity ranging from, for example, about 1500 to about 2500 watts/(meter*kelvin).

Further, in some cases, a thermal management coating described herein exhibits a thermal conductance described herein in a direction within the lateral (x, y) plane of the coating, as opposed to in the vertical (z) direction. In some implementations, a thermal management coating described herein exhibits a thermal conductance described herein in any arbitrary direction or in a plurality of directions within the lateral plane.

In some implementations, the thermal management coatings described herein exhibit good optical transparency. For example, the thermal management coating exhibits an optical transparency ranging from about 30 percent to about 90 percent, such as about 60 percent to about 90 percent, to incident radiation having a wavelength ranging from 350 nm to 750 nm. The higher range of optical transparency (e.g., about 60 percent to about 90%) may be useful for devices that absorb or emit radiation, such as solar cells, LEDs and so forth.

Figure 5:
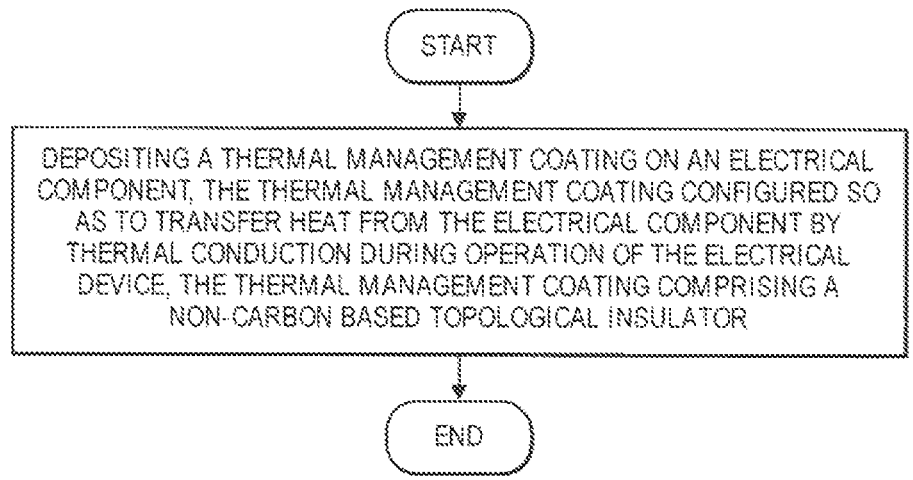
FIG. 5 illustrates a flow chart of a method of making an electrical device, according to an implementation of the present disclosure.

The electrical devices of the present disclosure can be made by any suitable method. Referring to FIG. 5, one example of a method of making the electrical devices of the present disclosure comprises depositing a thermal management coating on an electrical component, the thermal management coating configured so as to transfer heat from the electrical component by thermal conduction during operation of the electrical device. The thermal management coating comprises a non-carbon based topological insulator. The method can further include disposing an electrical component on a substrate assembly of the electrical device. The thermal management coating is configured to conduct heat from the electrical component to a heat sink.

The method of depositing the thermal management coating can include depositing one or more topological insulating layers. As an example, 2 to 25 layers of the topological insulator are deposited, wherein each layer of the plurality of layers physically contacts at least one adjacent layer of the plurality of layers. The topological insulator layer can comprise a two-dimensional monolayer or a three-dimensional layer having any desired thickness described herein for the thermal management coating. The topological insulators can be in the form of nanotubes, as described herein. Suitable methods for depositing topological insulating layers, including topological nanotubes, are known in the art.

The method can further comprise depositing a plurality of carbon nanotubes onto the thermal management coating such that the plurality of carbon nanotubes extend from a surface of the thermal management coating. Methods for depositing and/or aligning nanotubes, such carbon nanotubes, are known in the art.

Figure 6:
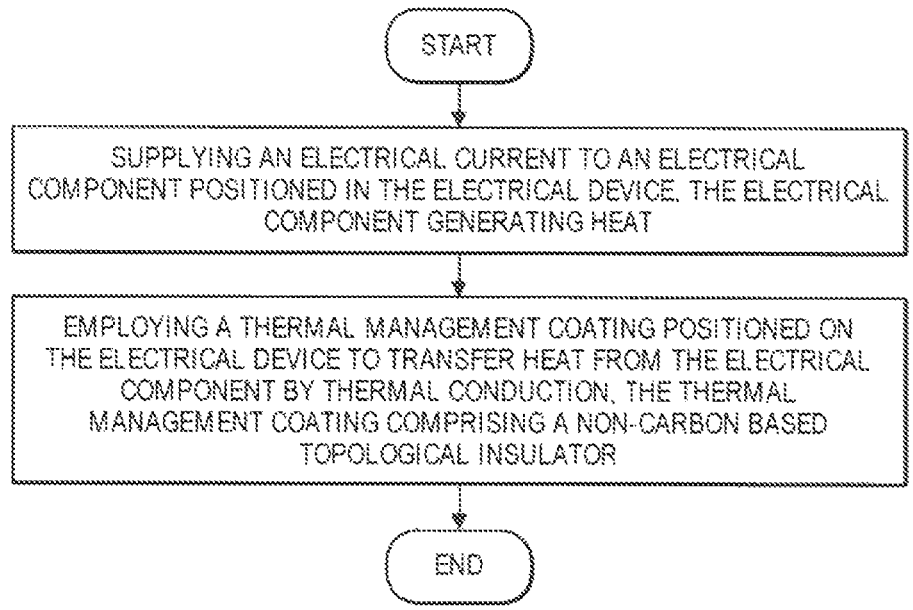
FIG. 6 illustrates a method of managing heat in an electrical device, according to an implementation of the present disclosure.

The present disclosure is also directed to a method of managing heat in an electrical device. Referring to FIG. 6, the method comprises supplying current to an electrical component positioned in the electrical device, the electrical component generating heat. A thermal management coating positioned on the electrical device is employed to transfer heat from the electrical component by thermal conduction. The thermal management coating comprises a non-carbon based topological insulator. Any of the thermal management coatings of the present disclosure can be employed.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including," "includes," "having," "has." "with," or variants thereof are used in either the detailed description and the claims, such terms are intended to be inclusive in a manner similar to the term "comprising." Further, in the discussion and claims herein, the term "about" indicates that the value listed may be somewhat altered, as long as the alteration does not result in nonconformance of the process or structure to the intended purpose described herein. Finally, "exemplary" indicates the description is used as an example, rather than implying that it is an ideal.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompasses by the following claims.

What is claimed is:

1. An electrical device, comprising:
an electrical component configured to generate heat during operation of the electrical device; and
a thermal management coating configured to transfer heat from the electrical component by thermal conduction, the thermal management coating comprising a non-carbon based topological insulator, the non-carbon based topological insulator having a thermal conductance ranging from about 10 MW/m$^2$K to about 50 MW/m$^2$K.

2. The electrical device of claim 1, wherein the thermal management coating comprises an element of antimony (Sb), bismuth (Bi), selenium (Se) or tellurium (Te), or combinations thereof.

3. The electrical device of claim 2, wherein the thermal management coating comprises a compound of $Bi_{1-x}Sb_x$ (0<x<1), $Bi_{1-x}Te_x$ (0<x<1), $Bi_{1-x}Te_x$ (0<x<1), Sb, $Bi_2Se_3$, $Bi_2Te_3$, $Sb_2Te_3$, $Bi_2Te_2Se$, $(Bi,Sb)_2Te_3$, $Bi_{2-x}Sb_xTe_{3-y}Se_y$ (0≤x≤2; 0≤y≤3), $Bi_{2-x}Sb_xTe_{3-y}Se_y$ (0≤x≤2; 1≤y≤3), $Bi_2Te_{1.6}S_{1.4}$, $Bi_{1.1}Sb_{0.9}Te_2S$, $Sb_2Te_2Se$, $Bi_2(Te,Se)_2(Se,S)$, $TlBiSe_2$, $TlBiTe_2$, $TlBi(S_{1-x},Se_x)_2$ (0.5≤x≤1), $Pb(Bi_{1-x}Sb_x)_2Te_4$ (0≤x≤1), $PbBi_2Te_4$, $PbSb_2Te_4$, $PbBi_4Te_7$, $GeBi_2Te_4$, $GeBi_{4-x}Sb_xTe_7$ (0≤x≤4), $(PbSe)_5(Bi_2Se_3)_3$, $(PbSe)_5(Bi_2Se_3)_6$, $(Bi_2)(Bi_2Se_{2.6}S_{0.4})$, $Bi_4Se_3$, $Bi_4Se_{2.6}S_{0.4}$, $(Bi_2)(Bi_2Te_3)_2$, SnTe, $Pb_{1-x}Sn_xSe$ (0<x<1), $Pb_{1-x}Sn_xTe$ (0<x<1), $Pb_{0.77}Sn_{0.23}Se$, $Bi_{1.84-x}Fe_{0.16}Ca_xSe_3$ (0≤x≤1.84), $Cr_{0.08}(Bi_{0.1}Sb_{0.9})_{1.92}Te_3$, $(Dy_xBi_{1-x})_2Te_3$ (0<x<1), $Ni_xBi_{2-x}Se_3$ (0<x<2), $(Ho_xBi_{1-x})_2Se_3$ (0≤x<1), $Ag_2Te$, $SmB_6$, $Bi_{14}Rh_3I_9$, $Bi_{2-x}Ca_xSe_3$ (0<x<2), $Bi_{2-x}Mn_xTe_3$ (0<x<2), $Ba_2BiBrO_6$, $Ba_2BiIO_6$, $Ca_2BiBrO_6$, $Ca_2BiIO_6$, $Sr_2BiBrO_6$ or $Sr_2BiIO_6$, or combinations thereof.

4. The electrical device of claim 1, wherein the thermal management coating comprises a plurality of layers of the non-carbon based topological insulator, each layer of the plurality of layers physically contacting at least one adjacent layer of the plurality of layers.

5. The electrical device of claim 4, wherein the thermal management coating comprises 2 to 25 layers of the non-carbon based topological insulator.

6. The electrical device of claim 1, wherein the thermal management coating has a weight percent of the electrical device that ranges from about 0.001 weight percent to about 0.3 weight percent, based on the total weight of the electrical device.

7. The electrical device of claim 1, wherein:
the electrical component is at least one device selected from an electrical contact, a transformer, a resistor, a capacitor, a battery, an inductor, a microprocessor, an integrated circuit, a memory device and a circuit board; and
the thermal management coating is on, and physically contacts, the electrical component.

8. An electrical device, comprising:
an electrical component configured to generate heat during operation of the electrical device;
a thermal management coating configured to transfer heat from the electrical component by thermal conduction, the thermal management coating comprising a non-carbon based topological insulator; and
a plurality of carbon nanotubes on, and extending from, the non-carbon based topological insulator.

9. The electrical device of claim 8, wherein the plurality of carbon nanotubes extend from the thermal management coating at an angle of from 0° to 90° relative to a direction parallel to an outermost surface of the electrical component.

10. The electrical device of claim 1, further comprising a substrate assembly on which the electrical component is positioned, and a heat sink on the substrate assembly, the thermal management coating configured to transfer heat from the electrical component to the heat sink by thermal conduction.

11. A method of making an electrical device, the method comprising:
depositing a thermal management coating on an electrical component, the thermal management coating configured so as to transfer heat from the electrical component by thermal conduction during operation of the electrical device, the thermal management coating comprising a non-carbon based topological insulator, the non-carbon based topological insulator having a thermal conductance ranging from about 10 MW/m$^2$K to about 50 MW/m$^2$K.

12. The method of claim 11, wherein the thermal management coating comprises an element of antimony (Sb), bismuth (Bi), selenium (Se) or tellurium (Te), or combinations thereof.

13. The method of claim 11, wherein the depositing of the thermal management coating comprises depositing a plurality of layers of the non-carbon based topological insulator, wherein each layer of the plurality of layers physically contacts at least one adjacent layer of the plurality of layers.

14. The method of claim 11, further comprising depositing a plurality of carbon nanotubes onto the thermal management coating such that the plurality of carbon nanotubes extend from a surface of the thermal management coating.

15. A method of managing heat in an electrical device, the method comprising:
supplying current to an electrical component positioned in the electrical device, the electrical component generating heat; and
employing a thermal management coating positioned on the electrical device to transfer heat from the electrical component by thermal conduction, the thermal management coating comprising a non-carbon based topological insulator, the non-carbon based topological insulator having a thermal conductance ranging from about 10 MW/m$^2$K to about 50 MW/m$^2$K.

16. The method of claim 15, wherein the thermal management coating comprises an element of antimony (Sb), bismuth (Bi), selenium (Se) or tellurium (Te), or combinations thereof.

17. The method of claim 16, wherein the thermal management coating comprises a plurality of layers of the non-carbon based topological insulator, wherein each layer of the plurality of layers physically contacts at least one adjacent layer of the plurality of layers.

18. A coating comprising a non-carbon based topological insulator deposited on a substrate; and a plurality of carbon nanotubes on, and extending from, the non-carbon based topological insulator.

19. The coating of claim 18, wherein the plurality of carbon nanotubes extend from the coating at an angle of from 0° to 90° relative to a direction parallel to an outermost surface of the substrate on which the coating is deposited.

20. The method of claim 15, wherein the thermal management coating comprises a compound of $Bi_{1-x}Sb_x$ (0<x<1), $Bi_{1-x}Te_x$ (0<x<1), $Bi_{1-x}Te_x$ (0<x<1), Sb, $Bi_2Se_3$, $Bi_2Te_3$, $Sb_2Te_3$, $Bi_2Te_2Se$, $(Bi,Sb)_2Te_3$, $Bi_{2-x}Sb_xTe_{3-y}Se_y$ (0≤x≤2; 0≤y≤3), $Bi_{2-x}Sb_xTe_{3-y}Se_y$ (0≤x≤2; 1≤y≤3), $Bi_2Te_{1.6}S_{1.4}$, $Bi_{1.1}Sb_{0.9}Te_2S$, $Sb_2Te_2Se$, $Bi_2(Te,Se)_2(Se,S)$, $TlBiSe_2$, $TlBiTe_2$, $TlBi(S_{2-x},Se_x)_2$ (0.5≤x≤1), $Pb(Bi_{1-x}Sb_x)_2Te_4$ (0≤x≤1), $PbBi_2Te_4$, $PbSb_2Te_4$, $PbBi_4Te_7$, $GeBi_2Te_4$, $GeBi_{4-x}Sb_xTe_7$ (0≤x≤4), $(PbSe)_5(Bi_2Se_3)_3$, $(PbSe)_5(Bi_2Se_3)_6$, $(Bi_2)(Bi_2Se_{2.6}S_{0.4})$, $Bi_4Se_3$, $Bi_4Se_{4.6}S_{0.4}$, $(Bi_2)(Bi_2Te_3)_2$, SnTe, $Pb_{1-x}Sn_xSe$ (0<x<1), $Pb_{1-x}Sn_xTe$ (0<x<1), $Pb_{0.77}Sn_{0.23}Se$, $Bi_{1.84-x}Fe_{0.16}Ca_xSe_3$ (0≤x≤1.84), $Cr_{0.08}(Bi_{0.1}Sb_{0.9})_{1.92}Te_3$, $(Dy_xBi_{1-x})_2Te_3$ (0<x<1), $Ni_xBi_{2-x}Se_3$ (0<x<2), $(Ho_xBi_{1-x})_2Se_3$ (0≤x<1), $Ag_2Te$, $SmB_6$, $Bi_{14}Rh_3I_9$, $Bi_{2-x}Ca_xSe_3$ (0<x<2), $Bi_{2-x}Mn_xTe_3$ (0<x<2), $Ba_2BiBrO_6$, $Ba_2BiIO_6$, $Ca_2BiBrO_6$, $Ca_2BiIO_6$, $Sr_2BiBrO_6$ or $Sr_2BiIO_6$, or combinations thereof.

* * * * *